United States Patent
Yu et al.

(10) Patent No.: US 9,942,997 B2
(45) Date of Patent: Apr. 10, 2018

(54) DISPLAY DEVICE

(71) Applicants: HONGFUJIN PRECISION ELECTRONICS(CHONGQING)CO. LTD, Chongqing (CN); HON HAI PRECISION INDUSTRY CO., LTD., New Taipei (TW)

(72) Inventors: Hsin-Te Yu, New Taipei (TW); Te-Hsu Wang, New Taipei (TW); Zhao-Yu Wang, Shenzhen (CN); Ri-Dong Huang, Shenzhen (CN)

(73) Assignees: HONGFUJIN PRECISION ELECTRONICS, Chongqing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/339,948

(22) Filed: Nov. 1, 2016

(65) Prior Publication Data
US 2017/0367202 A1    Dec. 21, 2017

(30) Foreign Application Priority Data

Jun. 21, 2016    (CN) .......................... 2016 1 0448259

(51) Int. Cl.
*H05K 5/02*    (2006.01)
*H05K 5/00*    (2006.01)

(52) U.S. Cl.
CPC ......... *H05K 5/0217* (2013.01); *H05K 5/0017* (2013.01); *H05K 5/0221* (2013.01); *H05K 5/0234* (2013.01)

(58) Field of Classification Search
CPC .. H05K 5/0217; H05K 5/0221; H05K 5/0017; H05K 5/0234; H05K 5/00; G02F 1/133608; G02F 1/133308; G06F 1/16; G06F 1/1649; G06F 1/1601; G06F 1/1613; G06F 1/1633; G06F 1/1626
See application file for complete search history.

(56) References Cited

U.S. PATENT DOCUMENTS

| | | | | |
|---|---|---|---|---|
| 8,896,783 | B2 * | 11/2014 | Yu ..................... | G02F 1/133308 349/58 |
| 9,119,287 | B2 * | 8/2015 | Tsubaki ................... | H05K 7/00 |
| 9,389,449 | B2 * | 7/2016 | Bang ................. | G02F 1/133308 |
| 9,449,540 | B2 * | 9/2016 | Nozue ................. | G09F 15/0012 |
| 2004/0001330 | A1 * | 1/2004 | Kang ........................ | F21V 5/02 362/613 |
| 2004/0246397 | A1 * | 12/2004 | Kang ................ | G02F 1/133308 349/58 |

(Continued)

FOREIGN PATENT DOCUMENTS

TW    563868    11/2003
TW    M491307 U    12/2014

*Primary Examiner* — Steven T Sawyer
*Assistant Examiner* — Sagar Shrestha
(74) *Attorney, Agent, or Firm* — ScienBiziP, P.C.

(57) ABSTRACT

A display device includes a front frame, a display module installed in the front frame, and a rear cover connected with the front frame. The front frame includes a plurality of securing rods connected one by one. Each securing rod defines a receiving groove and a plurality of grabs. The display module includes a plurality of limiting plates. The rear cover includes a plurality of latch blocks. The limiting plate is received in the receiving groove. The latch block is inserted into the grab.

14 Claims, 5 Drawing Sheets

(56) References Cited

U.S. PATENT DOCUMENTS

| | | | |
|---|---|---|---|
| 2005/0128695 A1* | 6/2005 | Han | G06F 1/162 361/679.55 |
| 2005/0168499 A1* | 8/2005 | Williams | G06F 1/16 361/679.11 |
| 2007/0216825 A1* | 9/2007 | Hsu | G02F 1/133308 349/58 |
| 2008/0143918 A1* | 6/2008 | Kim | G02F 1/133608 349/58 |
| 2009/0059129 A1* | 3/2009 | Wang | G02B 6/0028 349/65 |
| 2013/0114018 A1* | 5/2013 | Kim | G02F 1/133308 349/58 |
| 2013/0176672 A1* | 7/2013 | Richard | F16M 11/10 361/679.22 |
| 2013/0235277 A1* | 9/2013 | Suwa | H04N 5/64 348/725 |
| 2014/0002969 A1* | 1/2014 | Hwang | H05K 5/0017 361/679.01 |
| 2014/0240906 A1* | 8/2014 | Seo | A47B 81/06 361/679.01 |
| 2015/0219955 A1* | 8/2015 | Son | G02F 1/133308 349/58 |
| 2017/0315400 A1* | 11/2017 | Ahn | G02F 1/133308 |
| 2017/0363798 A1* | 12/2017 | Hirayama | G02B 6/0055 |

\* cited by examiner

DISPLAY DEVICE

CROSS-REFERENCE TO RELATED APPLICATIONS

This application claims priority to Chinese Patent Application No. 201610448259.1 filed on Jun. 21, 2016 the contents of which, are incorporated by reference herein.

FIELD

The subject matter herein generally relates to display units, and more particularly to a display device.

BACKGROUND

Conventional display structure usually includes a front frame, a rear cover and a display module. The display screen is fixed by display front frame and display middle frame. The display module is secured by the front frame and the rear cover.

BRIEF DESCRIPTION OF THE DRAWINGS

Implementations of the present technology will now be described, by way of example only, with reference to the attached figures.

DETAILED DESCRIPTION

Figure 1:
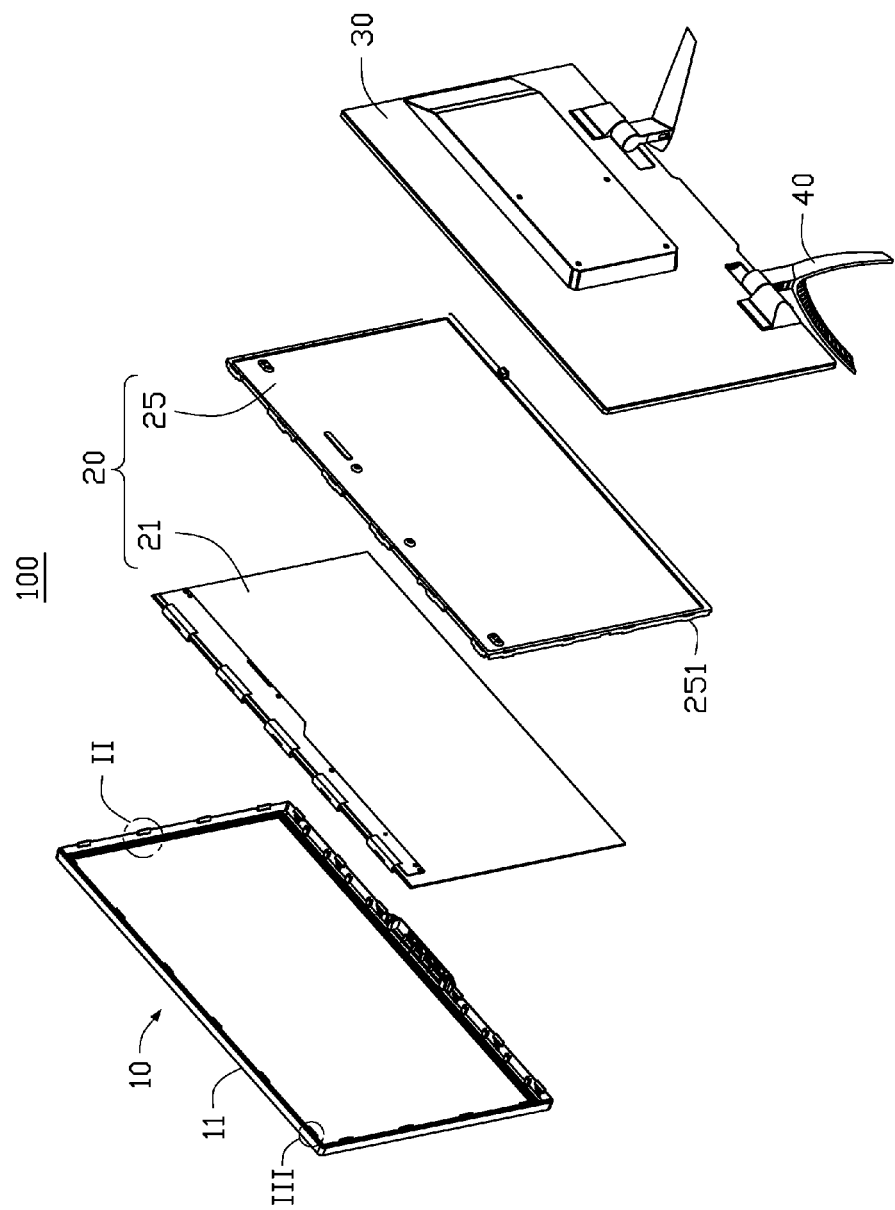
FIG. 1 is an exploded, isometric view of an embodiment of a display device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "outside" refers to a region that is beyond the outermost confines of a physical object. The term "inside" indicates that at least a portion of an object is contained within a boundary formed by another object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates one embodiment of a display device 100 which includes a front frame 10, a display module 20 installed in the front frame 10, a rear cover 30 connected with the front frame 10, and a bracket 40 rotatably installed on the rear cover 30.

Figure 2:
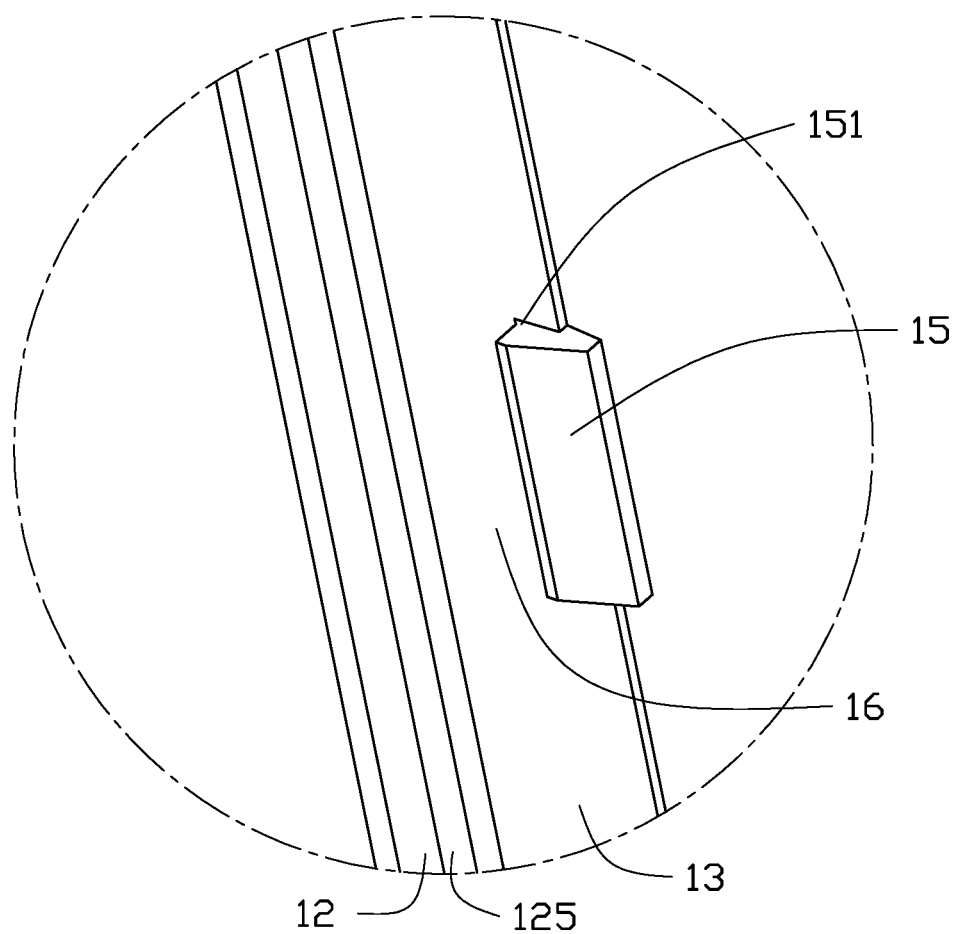
FIG. 2 is an enlarged, isometric view of circled portion II of a front frame of FIG. 1.
Figure 3:
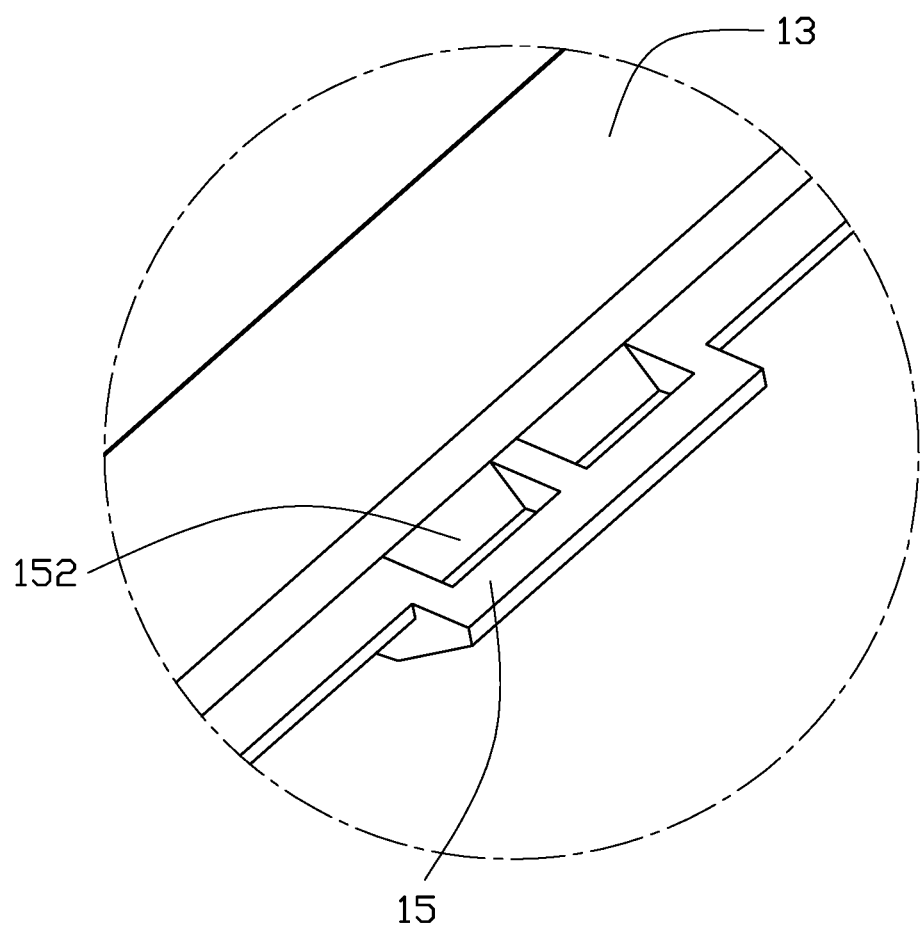
FIG. 3 is an enlarged, isometric view of circled portion III of the front frame of FIG. 1.

FIGS. 1 to 3 illustrate that the front frame 10 includes four connected securing rods 11. Two adjacent securing rods 11 are vertically connected to each other. Each securing rod 11 includes a baffle 12 and a caulking strip 13 perpendicularly connected to the baffle 12. The baffle 12 is configured to resist against the front end of the display module 20 to secure the display module 20. The side which is closest to the caulking strip 13 of each baffle 12 is equipped with a supporting plate 125. The display module 20 can resist against the supporting plate 125. The caulking strip 13 is configured to resist against the edge of the display module 20 to secure the display module 20. The side which is away from the baffle 12 of the caulking strip 13 is equipped with a plurality of grabs 15. The side which is close to the baffle 12 of the grab 15 defines a latch plane 151. The supporting plate 125, the caulking strip 13, and the latch plane 151 cooperatively define a receiving groove 16. The bottom of the grab 15 and the caulking strip 13 are substantially in the same plane. The grab 15 defines a plurality of slots 152. The rear cover 30 is configured to be latched in the slots 152.

The display module 20 includes a display screen module 21 and a backboard 25 connected with the display screen module 21. The display screen module 21 resists against the supporting plate 125 to be received in the front frame 10. A plurality of limiting plates 251 is installed around the edges of the backboard 25. The limiting plate 251 is substantially perpendicular to the backboard 25. The limiting plate 251 is configured to be received in the receiving groove 16. In at least one combination, the backboard can be connected with the display screen module 21 by adhesive or other means.

FIGS. 1 to 5 illustrate that a folding 31 is installed around the edges of the rear cover 30. The folding 31 is equipped with a plurality of latch blocks 315. A latch block 315 is configured to be inserted into the slot 152. The bracket 40 is rotatably installed on the back of the rear cover 30. The rear cover 30 can rotate relative to the bracket 40.

Figure 4:
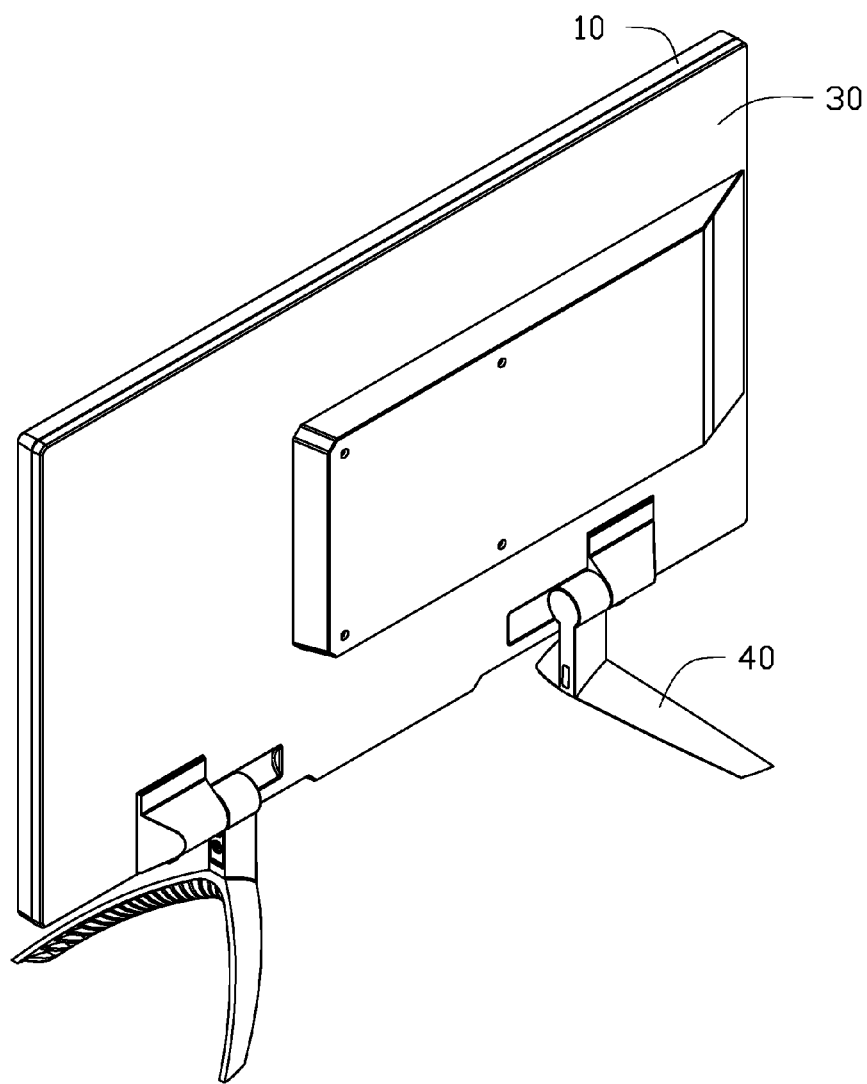
FIG. 4 is an assembled, isometric view of the display device of FIG. 1.
Figure 5:
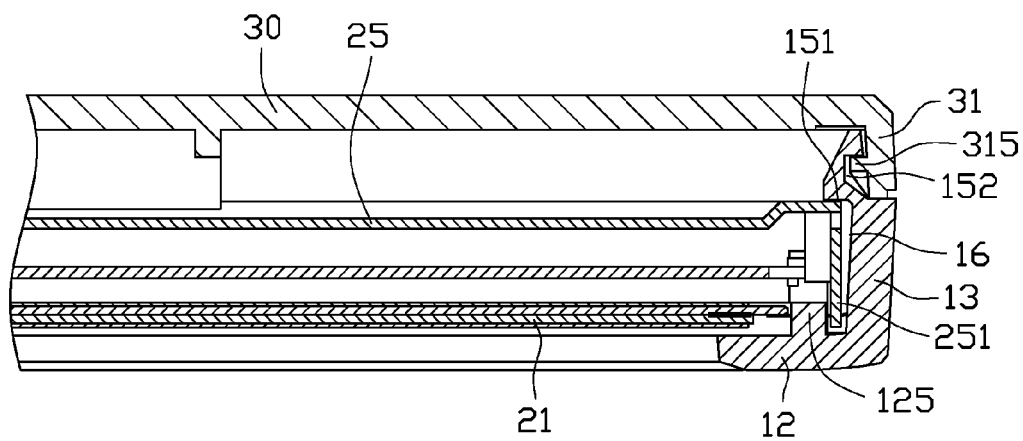
FIG. 5 is a cross sectional view of the display device along a line V-V of FIG. 4.

FIGS. 4 and 5 illustrate assembly of the device. The display screen module 21 is connected with the backboard 25. The display screen module 21 and the backboard 25 are located in the front frame 10. The front end of the display screen module 21 resists against the baffle 12. The display screen module 21 resists against the supporting plate 125. The limiting plate 251 is received in the receiving groove 16. The supporting plate 125 is founded and supported on the limiting plate 251. The backboard 25 resists against the latch plane 151 to install the display module 20 on the front frame 10. The rear cover 30 resists against the display module 20 and is fitted on the front frame 10. The latch block 315 is inserted into the slot 152 to secure the front frame 10 on the rear cover 30. The rear cover 30 is rotatably installed on the bracket 40. The display device 100 is thus assembled.

The embodiments shown and described above are only examples. Many details are often found in the art such as the other features of a display device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A display device, comprising:
a front frame comprising securing rods connected end to end, each securing rod defines a receiving groove and a plurality of grabs, each grab defining a slot opposite to the receiving groove;
a display module installed in the front frame, and comprising a limiting plate; and a rear cover defining a plurality of latch blocks;
wherein the limiting plate is received in the receiving groove, and the latch block is inserted into the slot, the securing rod further comprise a caulking strip, the grab extends from the caulking strip, the receiving groove is positioned a side of the caulking strip adjacent to the display module, the slot is positioned a side of the grab away from the display module;
wherein each baffle is equipped with a supporting plate, and the supporting plate is resisted against around the display module to secure the display module; and
wherein each baffle is equipped with a supporting plate, and the supporting plate is resisted against around the display module to secure the display module; and
wherein the caulking strip is perpendicularly connected with the baffle, the supporting plate, the caulking strip and the grab cooperatively define a receiving groove.

2. The display device of claim 1, wherein the grab is located on the caulking strip, the grab defines a latch plane close to the baffle, and the latch plane is resisted against the display module to secure the display module.

3. The display device of claim 2, wherein the bottom of the grab and the caulking strip are substantially on the same plane.

4. The display device of claim 1, wherein the display module comprises a display screen module, the display screen module is received in the front frame and resisted against the supporting plate.

5. The display device of claim 4, wherein the display module further comprises a backboard connected with the display screen module, and the limiting module is located on the backboard.

6. The display device of claim 1, wherein the around edges of the rear cover is equipped with a folding, and the latch block is located on the folding.

7. The display device of claim 1, wherein the display device further comprises two brackets installed on the rear cover, and the rear cover can rotate relatively to the bracket.

8. An electronic device, comprising:
a display device comprising:
a front frame comprising securing rods connected end to end, each securing rod defines a receiving groove and a plurality of grabs, each grab defining a slot opposite to the receiving groove;
a display module installed in the front frame, and comprising a limiting plate; and
a rear cover defining a plurality of latch blocks; and
two brackets installed on the display device;
wherein the limiting plate is received in the receiving groove, and the latch block is inserted into the slot, the securing rod further comprise a caulking strip, the grab extends from the caulking strip, the receiving groove is positioned a side of the caulking strip adjacent to the display module, the slot is positioned a side of the grab away from the display module, the display device can rotate relatively to the bracket;
wherein each securing rod comprises a baffle, and the baffle is resisted against the front end of the display module to secure display module;
wherein each baffle is equipped with a supporting plate, and the supporting plate is resisted against around the display module to secure the display module;
wherein the caulking strip perpendicularly connected with the baffle, the supporting plate, the caulking strip and the grab cooperatively define a receiving groove.

9. The electronic device of claim 8, wherein the grab is located on the caulking strip, the grab defines a latch plane close to the baffle, and the latch plane is resisted against the display module to secure the display module.

10. The electronic device of claim 9, wherein the bottom of the grab and the caulking strip are substantially on the same plane.

11. The electronic device of claim 8, wherein the display module comprises a display screen module, the display screen module is received in the front frame and resisted against the supporting plate.

12. The electronic device of claim 11, wherein the display module further comprises a backboard connected with the display screen module, and the limiting module is located on the backboard.

13. The electronic device of claim 8, wherein the around the edges of the rear cover is equipped with a folding, and the latch block is located on the folding.

14. The electronic device of claim 8, wherein the two brackets are installed on the rear cover, and the rear cover can rotate relatively to the bracket.

* * * * *

UNITED STATES PATENT AND TRADEMARK OFFICE
CERTIFICATE OF CORRECTION

PATENT NO.        : 9,942,997 B2                                      Page 1 of 1
APPLICATION NO.   : 15/339948
DATED             : April 10, 2018
INVENTOR(S)       : Hsin-Te Yu et al.

It is certified that error appears in the above-identified patent and that said Letters Patent is hereby corrected as shown below:

On the Title Page

Please replace Item (73) regarding "Assignees" with the following:
(73) HONGFUJIN PRECISION ELECTRONICS(CHONGQING) CO., LTD., Chongqing (CN);
HON HAI PRECISION INDUSTRY CO., LTD., New Taipei (TW)

Signed and Sealed this
Ninth Day of October, 2018

Andrei Iancu
*Director of the United States Patent and Trademark Office*